(12) United States Patent
Berger et al.

(10) Patent No.: US 7,361,943 B2
(45) Date of Patent: Apr. 22, 2008

(54) SILICON-BASED BACKWARD DIODES FOR ZERO-BIASED SQUARE LAW DETECTION AND DETECTOR ARRAYS OF SAME

(75) Inventors: Paul R. Berger, Columbus, OH (US); Niu Jin, Champaign, IL (US); Phillip E. Thompson, Springfield, VA (US); Sung-Yong Chung, Columbus, OH (US)

(73) Assignees: The Ohio State University, Columbus, OH (US); The United States of America, as represented by the Secretary of the Navy, Washington, DC (US)

( * ) Notice: Subject to any disclaimer, the term of this patent is extended or adjusted under 35 U.S.C. 154(b) by 168 days.

(21) Appl. No.: 11/407,120

(22) Filed: Apr. 19, 2006

(65) Prior Publication Data
US 2006/0284165 A1     Dec. 21, 2006

Related U.S. Application Data

(60) Provisional application No. 60/672,833, filed on Apr. 19, 2005.

(51) Int. Cl.
  *H01L 29/88* (2006.01)
(52) U.S. Cl. .......... 257/106; 257/25; 257/104; 257/199; 257/656; 257/E29.34
(58) Field of Classification Search ........ 257/106, 257/E29.34
See application file for complete search history.

(56) References Cited

U.S. PATENT DOCUMENTS 6,803,598 B1   10/2004   Berger et al.
7,105,866 B2 *  9/2006   El-Zein et al. ............. 257/104

OTHER PUBLICATIONS

Schulman et al., "Sb-Heterostructure Interband Backward Diodes," IEEE Electron Device Letters, vol. 21, No. 7, (2000).
Berger et al., "Si-Based Resonant Interband Tunneling Diodes and Quantum Functional Circuits," 7 pp., at http://www.ece.osu.edu/~berger/summ_ritd05.html, (2006).

(Continued)

Primary Examiner—Tu-Tu Ho
(74) Attorney, Agent, or Firm—Fay Sharpe LLP

(57) ABSTRACT

A Si-based diode (10, 10', 100) is formed by epitaxially depositing a Si-based diode structure on a silicon substrate. The Si-based diode structure includes a Si-based pn junction (16, 16', 18, 18', 30, 32, 160, 161) having a backward diode current-voltage characteristic in which the forward tunneling current is substantially smaller than the backward tunneling current at comparable voltage levels. In some embodiments, the Si-based pn junction includes at least one non-silicon or silicon alloy layer such as at least one SiGe layer (16, 16', 160, 161). In some embodiments, at least one delta doping (30, 32) is disposed on the silicon substrate in or near the pn junction, that together with the Si-based pn junction define an electrical junction having the backward diode current-voltage characteristic. A large area detector array may include a plurality of such Si-based diodes (10, 10', 100).

29 Claims, 6 Drawing Sheets

OTHER PUBLICATIONS

Jin et al., "High sensitivity Si-Based Backward Diodes for Zero-Biased Square-Law Detection . . . ," IEEE Electron Device Letters, vol. 26, No. 8, (2005).

Geppert, "Quantum transistors: toward nanoelectronnics," IEEE Spectrum, pp. 46-51, (2000).

Geppert, "The Amazing Vanishing Transistor Act," IEEE Spectrum, pp. 28-33, (2002).

"Emerging Research Devices," The International Technology Roadmap for Semiconductors, pp. 1-49, (2003).

Rommel et al., "Room temperature operation of epitaxially grown . . . ," Applied Physics Letters, vol. 73, No. 15, (1998).

Jin et al., "Phosphorus diffusion in Si-based resonant interband tunneling diodes . . . ," Materials Science in Semiconductor Processing 8, pp. 411-416, (2005).

Jin et al., "Improved vertically stacked Si/SiGe resonant interband . . . ," Electronics Letters, vol. 40, No. 24, (2004).

Jin et al., "Tri-State Logic Using Vertically Integrated Si-SiGe Resonant . . . ," IEEE Electron Device Letters, vol. 25, No. 9, (2004).

Jin et al., "RF Performance and Modeling of Si/SiGe Resonant Interband Tunneling Diodes," IEEE Transactions on Electron Devices, vol. 52, No. 10, (2005).

Jin et al., "Temperature dependent DC/RF performance of Si/SiGe resonant," Electronics Letters, vol. 41, No. 9, (2005).

Sudirgo et al., "Monolithically integrated Si/SiGe resonant interband tunnel diode/CMOS . . . ," Solid-State Electronics 48 pp. 1907-1910, (2004).

Chung et al., "Three-terminal Si-based negative differential resistance circuit element . . . ," Applied Physics Letters, vol. 84, No. 14, (2004).

Jin et al., "151 kA/cm$^2$ [eal cirremt densities in Si/SiGe resonant interband tunneling diodes . . . ," Applied Physics Letters, vol. 83, No. 16, (2003).

Jin et al., "Diffusion Barrier Cladding in Si/SiGe Resonant Interband Tunneling Diodes . . . ," IEEE Transactions on Electron Devices, vol. 50, No. 9, (2003).

Hobart et al., "'$p$-on-$n$' Si interband tunnel diode grown by molecular beam epitaxy," J. Vac. Sci. Technol. B pp. 290-293, (2001).

Thompson et al., "Epitaxial Si-based tunnel diodes," Thin Solid Films 380, pp. 145-150, (2000).

Dshiell et al., "Current-Voltage Characteristics of High Current Density Silicon . . . ," IEEE Transactions on Electron Devices, vol. 47, No. 9, (2000).

Thompson et al., "Si resonant interband tunnel diodes grown by low-temperature . . . ," Applied Physics Letters, vol. 75, No. 9, (1999).

Rommel et al., "Epitaxially Grown Si Resonant Interband Tunnel Diodes . . . ," IEEE Electron Device Letters, vol. 20, No. 7, (1999).

Chung et al., "Annealing of defect density and excess currents in Si-based tunnel . . . ," Journal of Applied Physics, vol. 96, No. 1, (2004).

Weaver et al., "Radiation tolerance . . . ," Journal of Applied Physics, vol. 95, No. 11, (2004).

Rivas et al., "Full band modeling of the excess current in a delta-doped . . . ," Journal of Applied Physics, vol. 94, No. 8, (2003).

Chung et al., "Growth temperature and dopant species effects on deep levels in Si grown . . . ," Journal of Applied Physics, vol. 93, No. 11, (2003).

Rivas et al., "Full-band simulation of indirect phonon assisted tunneling . . . ," Applied Physics Letters, vol. 78, No. 6, (2001).

Rommel et al., "Development of δB/i-Si/δSb and . . . ," 2 pp, unknown date.

Rommel et al., "Si-based Interband Tunneling Devices for High-Speed Logic and . . . ," IEEE, 3 pp., (1998).

* cited by examiner

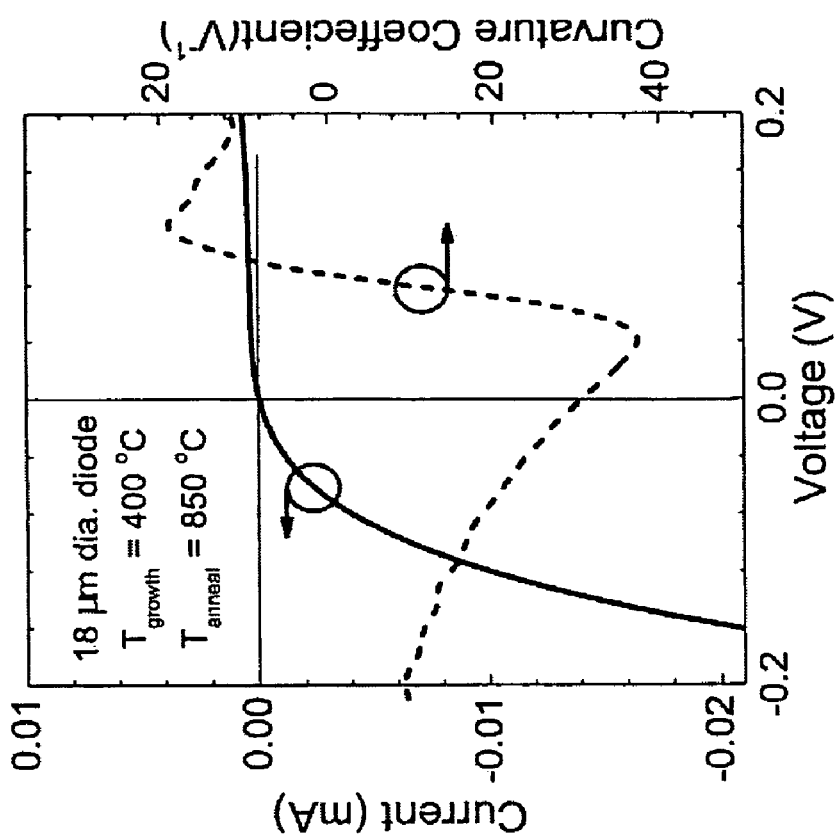
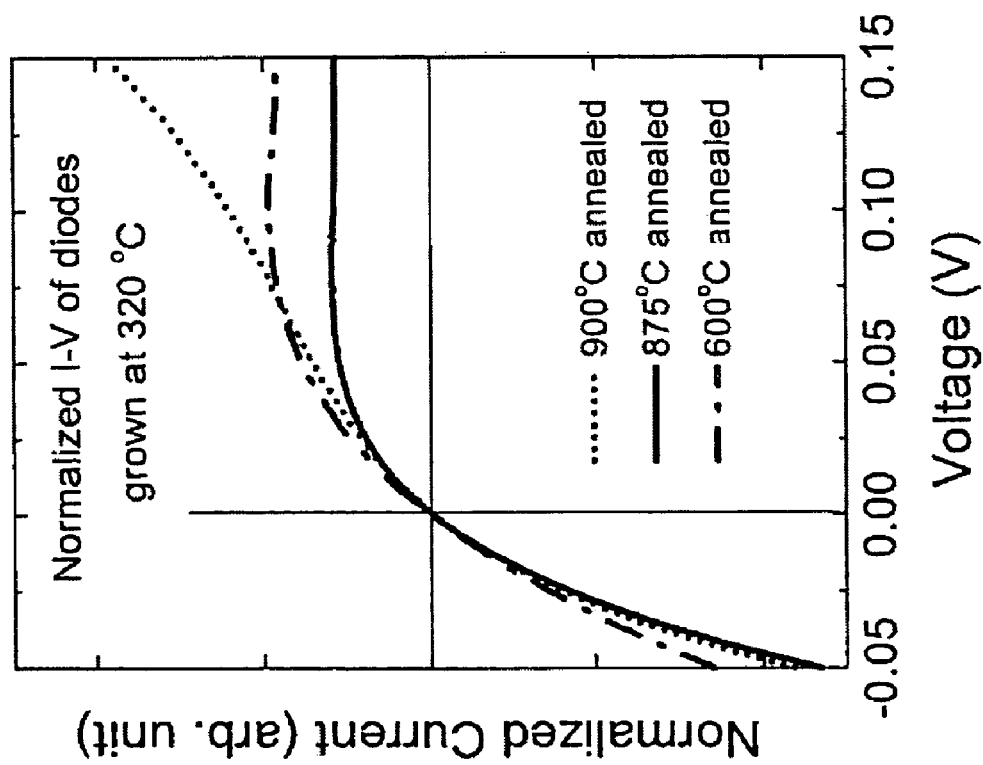
Fig. 2A
Fig. 2B

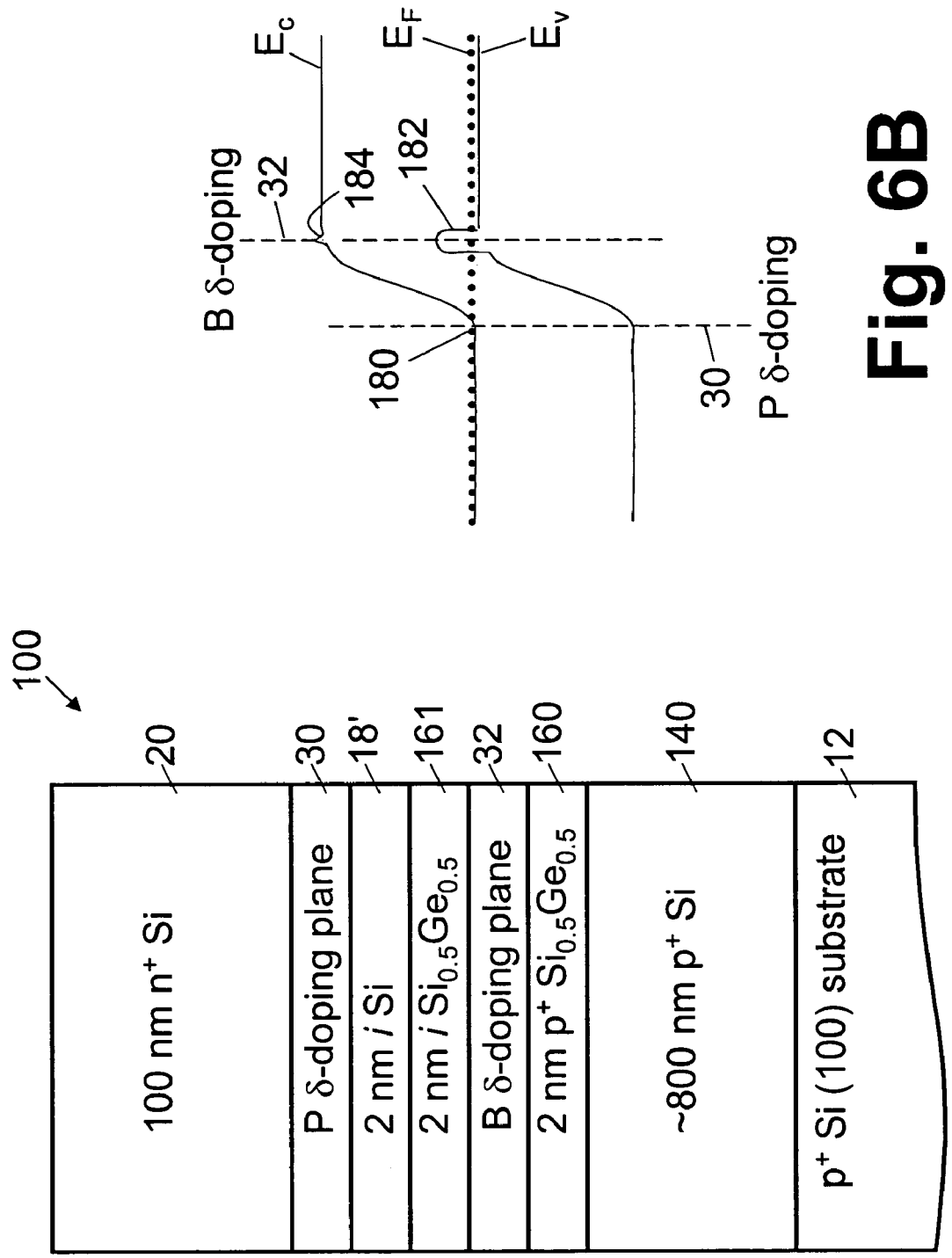

SILICON-BASED BACKWARD DIODES FOR ZERO-BIASED SQUARE LAW DETECTION AND DETECTOR ARRAYS OF SAME

This application claims the benefit of U.S. Provisional Application No. 60/672,833 filed Apr. 19, 2005. U.S. Provisional Application No. 60/672,833 filed Apr. 19, 2005 is incorporated by reference herein in its entirety.

This invention was made with Government support under NSF grant no. ESC-0323657 awarded by the National Science Foundation (NSF). The Government has certain rights in this invention.

BACKGROUND

The following relates to optical detectors, radiometers, imagers, and so forth. It finds particular application in conjunction with silicon-based millimeter-wavelength detectors, radiometers, and imagers, and will be described with particular reference thereto. However, the following is amenable to other like applications such as detectors, radiometers, and imagers operating in other wavelength ranges.

Passive imaging systems and radiometers employ detectors operating at millimeter-wave frequencies. Biased Schottky diodes are commonly used for these applications. However, the biasing circuit greatly increases the system and pixel complexity and also leads to extra noise and drift.

Zero-bias diode detectors are advantageous because no biasing circuit is required. Zero-bias diode detectors should have a large zero bias nonlinearity or curvature. Discrete Ge backward diodes and planar-doped barrier GaAs diodes have previously been used for zero bias detection with high nonlinearity. However, because of the chosen substrates (germanium substrates for Ge backward diodes and GaAs substrates for planar-doped barrier GaAs diodes), these devices are not readily amenable to imaging applications, where a mass-producible technology is required to fabricate a large number of identical devices into compact pixelated imaging arrays. Recently, Sb-based heterojunction backward diodes were realized that are candidates for zero-bias detector applications due to their high sensitivity, high bandwidth, modest temperature dependence and mass production capability. However, the high cost of Sb-based backward diodes and their incompatibly with main-stream silicon read-out circuitry are problematic.

BRIEF DESCRIPTION

In accordance with certain embodiments illustrated herein, there is disclosed a backward diode, including an n-type region, a p-type region adjacent the n-type region to define a silicon-based p-n junction, and a tunnel barrier disposed at or near the silicon based p-n junction. The tunnel barrier causes the forward tunneling current to be substantially smaller than the backward tunneling current at comparable voltage levels. A portion of the n-type region at or near the silicon-based p-n junction has the Fermi level near the conduction band and a portion of the p-type region at or near the silicon-based p-n junction has the Fermi level near or below the valence band.

In accordance with certain embodiments illustrated herein, there is disclosed a backward diode, including an n-type region, a p-type region adjacent the n-type region to define a silicon-based p-n junction, and a quantum well disposed at or near the silicon-based p-n junction. The quantum well causes a ratio of forward current to backward current at comparable forward and reverse bias voltage levels to be substantially less than unity. At least one of: (i) a portion of the n-type region at or near the silicon-based p-n junction has its Fermi level near the conduction band; and (ii) a portion of the p-type region at or near the silicon-based p-n junction has its Fermi level near or below the valence band.

In accordance with certain embodiments illustrated herein, there is disclosed a Si-based diode including a silicon substrate and a Si-based pn junction disposed on the silicon substrate. The Si-based pn junction includes silicon and at least one SiGe layer that reduces a tunneling barrier height. The Si-based pn junction has a backward diode current-voltage characteristic in which the forward tunneling current is substantially smaller than the backward tunneling current at comparable voltage levels.

In accordance with certain embodiments illustrated herein, there is disclosed a Si-based diode including a silicon substrate and a Si-based pn junction disposed on the silicon substrate. At least one delta doping is disposed on the silicon substrate in or near the pn junction, the at least one delta doping together with the Si-based pn junction defining an electrical junction having a backward diode current-voltage characteristic in which the forward tunneling current is substantially smaller than the backward tunneling current at comparable voltage levels.

In accordance with certain embodiments illustrated herein, there is disclosed a Si-based diode formed by a method including epitaxially depositing a Si-based diode structure on a silicon substrate. The Si-based diode structure includes a Si-based pn junction having a backward diode current voltage characteristic in which the forward tunneling current is substantially smaller than the backward tunneling current at comparable voltage levels.

BRIEF DESCRIPTION OF THE DRAWINGS

In FIG. 1A, layer thicknesses and lateral dimensions are not drawn to scale.

FIG. 2A plots current-voltage (I-V) characteristics of Si-based diodes grown at 320° C. and annealed at 600° C., 875° C., and 900° C., normalized using a multiplicative scaling factor to have identical zero biased junction conductance (dI/dV).

FIG. 2B plots the I-V characteristic, along with the curvature coefficient $\gamma$ plotted as a function of bias voltage, for the backward diode grown at 400° C. and annealed at 850° C.

In FIG. 3, layer thicknesses and lateral dimensions are not drawn to scale.

FIG. 6A diagrammatically shows a cross-sectional view of another Si-based backward diode structure. In FIG. 6A, layer thicknesses and lateral dimensions are not drawn to scale.

FIG. 6B diagrammatically shows an estimated zero bias band structure in the vicinity of the pn junction for the diode structure of FIG. 6A.

DETAILED DESCRIPTION

Epitaxially grown high sensitivity Si-based backward diodes have been fabricated which exhibit a curvature coefficient of 31 $V^{-1}$ and associated junction capacitance of 9 fF/$\mu m^2$ at room temperature. This curvature corresponds to a low frequency voltage sensitivity, $\beta_v$, of 3100 V/W when driven from a 50Ω source. Modeling indicates that an intrinsic cutoff frequency over 100 GHz can be achieved with Ni silicide technology which yields low contact resistance in the range of $10^{-7}$ Ω·$cm^2$.

To obtain highly nonlinear current-voltage characteristics with a high curvature coefficient at zero bias, forward tunneling current should be minimized so that it can be substantially smaller than the backward tunneling current at comparable voltage levels. Since the amount of forward tunneling current depends on the available empty states on the p-side and available electrons in n-side, one approach is to reduce the average majority carrier concentration at an Esaki tunnel junction, so that the Fermi level is just below the valence band (i.e, just below the valence band edge) on the p-side and just above the conduction band (i.e., just above the conduction band edge) on the n-side, respectively. (For comparison, a typical resonant interband tunneling diode (RITD) is more heavily doped such that the Fermi level is substantially below the valence band edge on the p-side and substantially above the conduction band edge on the n-side at least immediately adjacent the pn junction, so as to provide empty states to enhance forward tunneling current.) In some embodiments disclosed herein, the Fermi level is adjusted by controlled dopant diffusion during post-growth rapid thermal annealing.

EXAMPLE 1

Si/SiGe Backward Diode

Figure 1B:
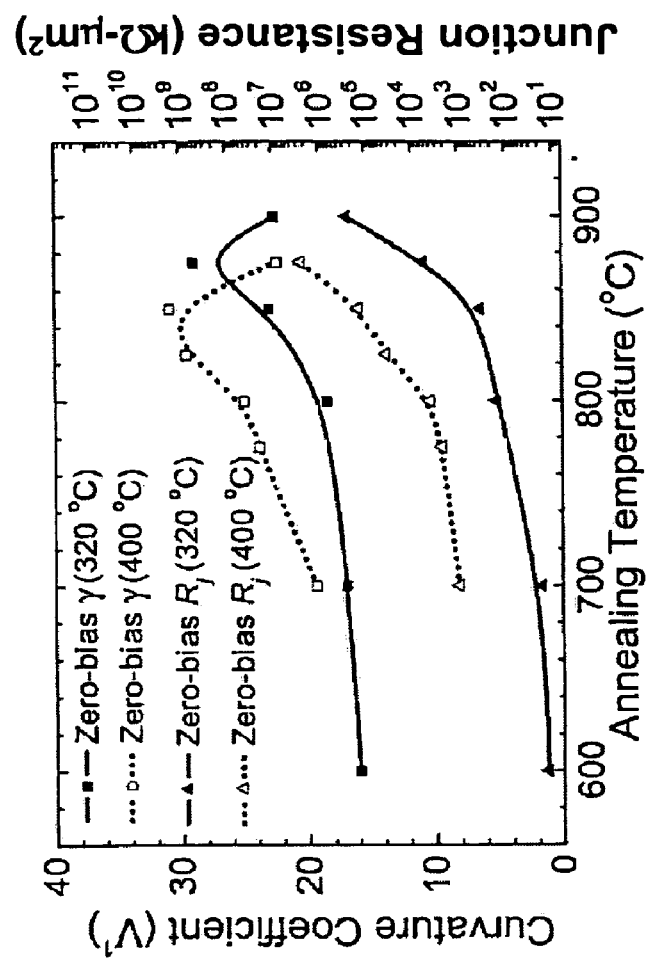
FIG. 1B plots measured curvature coefficient $\gamma$ and junction resistance $R_j$ for 18 µm diameter Si/SiGe backward diodes grown at 320° C. and 400° C. as functions of annealing temperature.
Figure 1A:
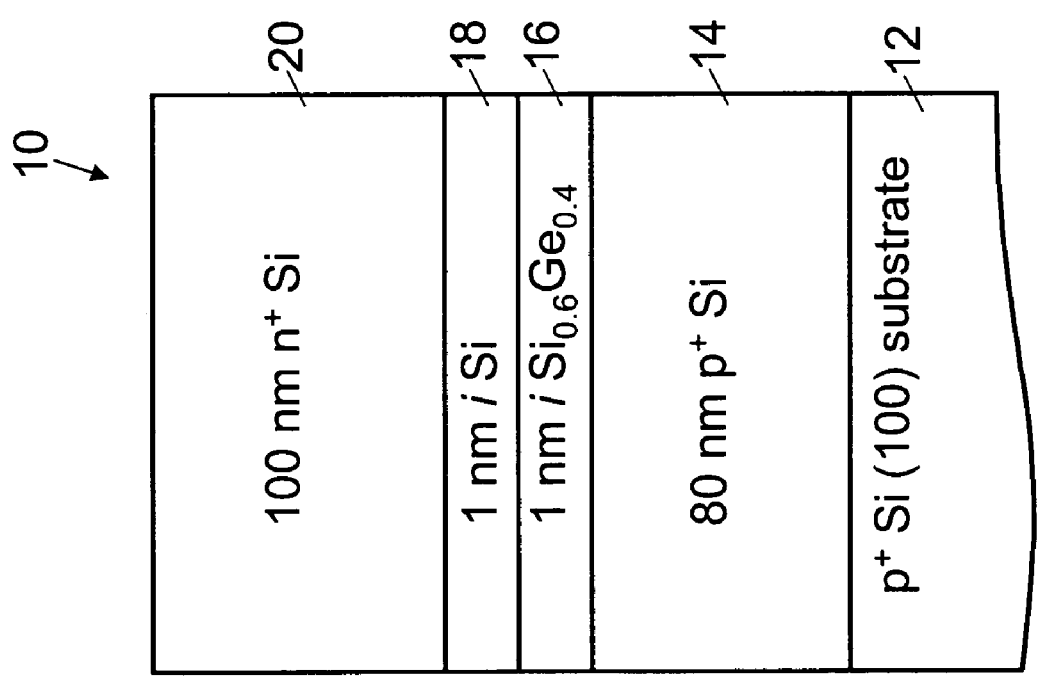
FIG. 1A diagrammatically shows a cross-sectional view of a Si-based backward diode structure that was fabricated and tested.

With reference to FIG. 1A, a Si-based backward diode structure 10 was fabricated. The Si-based backward diode structure 10 is a step p-i-n structure formed on a $p^+$ Si (100) substrate 12 and includes an 80 nm boron (B)-doped $p^+$ Si layer 14, an active region including a 1 nm $Si_{0.6}Ge_{0.4}$ layer 16 and a 1 nm Si layer 18, and a 100 nm phosphorous (P)-doped $n^+$ Si cap layer 20. The active region layers 16, 18 are nominally undoped. Without being limited to any particular theory of operation, it is believed that the SiGe layer 16 reduces the tunnel barrier height, to enhance the momentum mixing, and hence to reduce the junction resistance.

Several samples of the structure 10 of FIG. 1A were grown by molecular beam epitaxy (MBE), using elemental Si and Ge in electron-beam sources. The substrates 12 were 75 mm B-doped (ρ=0.015-0.04Ω·cm) Si (100) wafers. The nominal doping levels for both the p-side 14 and n-side 20 are $5\times10^{19}$ $cm^{-3}$. Two structures were grown with different substrate temperatures (320° C. and 400° C.) during growth of the active region 16, 18. The low growth temperatures are employed to minimize Ge and dopant segregation.

Prior to device fabrication, portions of the grown wafers were rapid thermal annealed (RTA) using a forming gas ambient ($N_2/H_2$) in a Modular Process Technology corporation RTP-600S furnace at temperatures between 600° C. and 900° C. for 1 minute. Without being limited to any particular theory of operation, it is believed that the anneal performs at least two functions. The anneal is believed to controllably interdiffuse the dopant atoms so that various effective doping levels at the metallurgical junction can be readily obtained by varying the annealing temperatures rather than growing multiple MBE wafers. This enables rapid prototyping. The anneal is also believed to remove point defects created during the low temperature MBE growth, in order to suppress the excess current component attributed to defect-related tunneling. Excess current has a concave-up characteristic, which will unfavorably compete with the concave-down characteristic of the desired forward tunneling current, and effectively reduce the curvature coefficient at zero bias. The device fabrication process is substantively the same as the process used to fabricate SiGe resonant interband tunneling diodes, described for example in Niu Jin et al., "Diffusion barrier cladding in Si/SiGe resonant interband tunneling diodes and their patterned growth on PMOS source/drain regions," *Special Issue on "Nanoelectronics" in IEEE Transactions on Electron Devices*, vol. 50, pp. 1876-84 (2003), which is incorporated herein by reference in its entirety.

The curvature coefficient, γ, which is defined as the quotient of the second derivative by the first derivative, $(d^2I/dV^2)/(dI/dV)$, is a commonly used figure-of-merit to quantify backwards diode nonlinearity at zero bias. The voltage sensitivity, $\beta_v$, can subsequently be calculated to the first order by $\beta_v=2Z_s\gamma$, where $Z_s$ is the source impedance. Another relevant figure-of-merit is the junction resistance, $R_j$, determined by $R_j=dV/dI$ at zero bias.

With reference to FIG. 1B, the measured curvature coefficient γ and junction resistance $R_j$ for 18 μm diameter Si/SiGe backward diodes grown at 320° C. and 400° C., are plotted as functions of annealing temperature. For the diodes grown at 320° C., 600° C. annealing for 1 minute leads to a zero biased curvature coefficient γ of 16 $V^{-1}$ with a junction resistance $R_j$ of 13.5 kΩ μ$m^2$, which is close to the performance of a commercial discrete Ge backward diode for detector application (γ of 15.9 with a $R_j$ of 18.2 kΩ μ$m^2$) referenced in J. N. Schulman et al., "Sb-heterostructure interband backward diodes," *IEEE Elect. Dev. Lett.*, vol 21, pp. 353-355, 2000 (hereinafter "Schulman"). The junction resistance increases slowly as the annealing temperature increases for annealing temperatures below 800° C. However, when the annealing temperature exceeds 800° C., junction resistance $R_j$ rises sharply, which, without being limited to any particular theory of operation, is believed to be attributable to a significantly increasing tunneling barrier width due to the phosphorus (P) and boron (B) dopant interdiffusion and subsequent compensation of the central tunneling spacer region. The curvature coefficient, γ, exhibits a good correlation with junction resistance $R_j$ when annealing temperatures are below 875° C. At 875° C., a maximum curvature coefficient γ value of 29 $V^{-1}$ is obtained, which is almost double that of the commercial discrete Ge backward diode detector reported in Schulman. When the annealing temperature is further increased to 900° C., the curvature coefficient γ drops to 23 $V^{-1}$.

With reference to FIG. 2A, current-voltage (I-V) characteristics are plotted of the diodes grown at 320° C. and annealed at 600° C., 875° C., and 900° C., normalized using a multiplicative scaling factor to have identical zero biased junction conductance (dI/dV). Since the zero biased junction conductance is exponentially dependent on the tunneling barrier width to the first order, the normalization process substantially excludes the effect of tunneling barrier width on the magnitude of the backward tunneling current, as well as the forward biased current, which consists of the desired forward tunneling current and any excess current present when the bias voltage is small. Note that the curvature coefficient γ is not altered by this normalization process. FIG. 2A shows that after this scaling process, the normalized backward tunneling currents are similar, while the normalized forward bias currents are significantly different. Since the curvature coefficient γ is determined by the ratio between the backward tunneling current and the forward biased current at the same small voltage level, the comparison between the curvature coefficient, γ of different diodes can be directly and readily made by comparing the normalized forward bias currents. A diode with a smaller normalized forward current under the same small bias condition will exhibit a larger curvature coefficient, γ.

With continuing reference to FIG. 2A, when the annealing temperature increases from 600° C. to 875° C., the normalized forward biased current decreases significantly. Without being limited to any particular theory of operation, this is believed to occur because dopant atoms diffuse faster at higher annealing temperature and reduce the effective doping densities on either side of the junction, so that the Fermi levels are much closer to the valence band on the p-side and the conduction band on the n-side respectively, so as to greatly limit the forward tunneling current. Also, the normalized excess current component, which is not explicitly shown here, is believed to be reduced with higher annealing temperatures. Without being limited to any particular theory of operation, this is believed to occur because point defects (such as vacancies created during low temperature MBE growth within the tunneling barrier) that can induce an excess current are more effectively removed by higher annealing temperatures. The reduced normalized forward biased current leads to a sharp increase in the curvature coefficient, γ, in the range from 600° C. to 875° C. However, when the annealing temperature is further increased to 900° C., a strong concave up current component appears that reduces the curvature coefficient, γ. With 900° C. annealing, it is believed that dopant interdiffusion at the junction is significant so that a high concentration of both dopant atoms diffuse into the active region (that is, tunneling barrier). As a consequence, defects may be formed that introduce extra energy states within the energy bandgap, which leads to an increased normalized excess current. Furthermore, the energy states within the energy bandgap introduced by the phosphorus-boron (P-B) pairs may also act as recombination-generation centers. It is further believed that, with the widened depletion region for 900° C. annealing from dopant compensation and neutralization, the recombination-generation current, which is a concave up current component, may become a more significant current component under small bias levels surpassing the tunneling component. Therefore, the concave up current which reduces the curvature coefficient, γ, at zero bias is identified as the excess current and/or recombination-generation current.

With returning reference to FIG. 1B, the diodes grown at 400° C. exhibit similar trends of curvature coefficient, γ, and junction resistance, $R_j$, versus annealing temperature, except a shift of optimal annealing temperatures to lower values was observed, which without being limited to any particular theory of operation is believed to be attributable to more dopant diffusion during the MBE growth using a higher substrate temperature.

With reference to FIG. 2B, the I-V characteristic is shown along with the curvature coefficient, γ, plotted as a function of bias voltage for the backward diode grown at 400° C. and annealed at 850° C. The zero biased curvature coefficient, γ, is as high as $31V^{-1}$, and the predicted low frequency voltage sensitivity $β_v$ of this backward diode with a 50 Ω source is 3100 V/W. The zero biased junction capacitance, $C_j$, of this diode was measured as 9 fF/μm² using a HP 4284 LCR meter. With recent demonstrations of Ni silicide technology which yields low contact resistance in the range of $10^{-7}$ Ω·cm² (see, for example, S. Sudirgo et al., "Monolithically integrated Si/SiGe resonant interband tunnel diode/CMOS demonstrating low voltage MOBILE operation," Solid State Electronics, vol. 48, pp. 1907-10 (2004) which is incorporated herein by reference, and S. Y. Chung et al., "3-Terminal Si-based negative differential resistance circuit element with adjustable Peak-To-Valley current ratios using a monolithic vertical integration," *Appl. Phys. Lett.*, vol. 84, pp. 2688-90 (2004), which is also incorporated herein by reference), the intrinsic cutoff frequency, $f_c=1/(2πR_sC_j)$, was estimated to be well over 100 GHz. Although the zero biased junction resistance $R_j$ in the first-generation devices is measured as 140 MΩ·μm² (taking the derivative using the current density as is typically done), the diodes still exhibit a usable unmatched sensitivity of 3100 V/W for a 50Ω source. Further routine optimization of the heterostructure is expected to further improve the junction resistance $R_j$. The high sensitivity, low junction capacitance, and SiGe heterojunction bipolar transistor (HBT) compatibility of the Si-based backward diodes grown by LT-MBE make these diodes suitable for zero-bias square-law detector applications operating in the millimeter-wave regime.

Fabricated high sensitivity Si-based backward diodes which are suitable for zero-bias square-law detector applications have been described with example reference to FIGS. 1A, 1B, 2A, and 2B. Post-growth annealing improves device performance and enables tailoring of the devices by controlling the annealing temperatures. Diodes grown at 320° C. and annealed at 600° C. showed a zero biased γ of 16 $V^{-1}$ with a $R_j$ of 13.5 kΩ μm², which is close to the performance of discrete commercial Ge backward diodes reported in Schulman. For the fabricated Si-based backward diodes, a 400° C. growth temperature and 850° C. annealing temperature provided the highest zero biased curvature coefficient γ of 31 $V^{-1}$ with a zero bias $C_j$ of 9 fF/μm², which projects to a low frequency voltage sensitivity $β_v$ for a 50Ω source of 3100 V/W, and an intrinsic cutoff frequency of over 100 GHz using state-of-the-art Ni silicide technology. It is to be appreciated that diodes grown using different MBE growth conditions (such as different substrate temperature, growth rate, germanium content of the SiGe layer or layers, or so forth) or having structural variations (such as different layer thicknesses, doping levels, or so forth) may have different optimal annealing temperatures, which can be determined through routine annealing and device testing experiments.

A plurality of high sensitivity Si-based backward diodes 10 are monolithically integratable with transistor circuitry the silicon substrate 12. Potential applications include large area focal plane arrays of such backward diodes 10 integrated with low noise amplifiers and readout circuitry, preferably using Si/SiGe CMOS or HBT-based circuits for ease of monolithic integration. The example fabricated Si-based backward diodes 10 exhibit a high zero-biased curvature coefficient, γ, of 31 $V^{-1}$ and a low zero biased junction capacitance, $C_j$, of 9 fF/μm², all at room temperature. The predicted low frequency voltage sensitivity, $β_v$, for a 50Ω source is 3100 V/W. The high sensitivity, low junction capacitance, and Si/SiGe HBT compatibility of the Si-based backward diodes make them suitable for zero-bias square-law detector applications.

EXAMPLE 2

Si/SiGe Backward Diode with Delta-Doping

Figure 3:
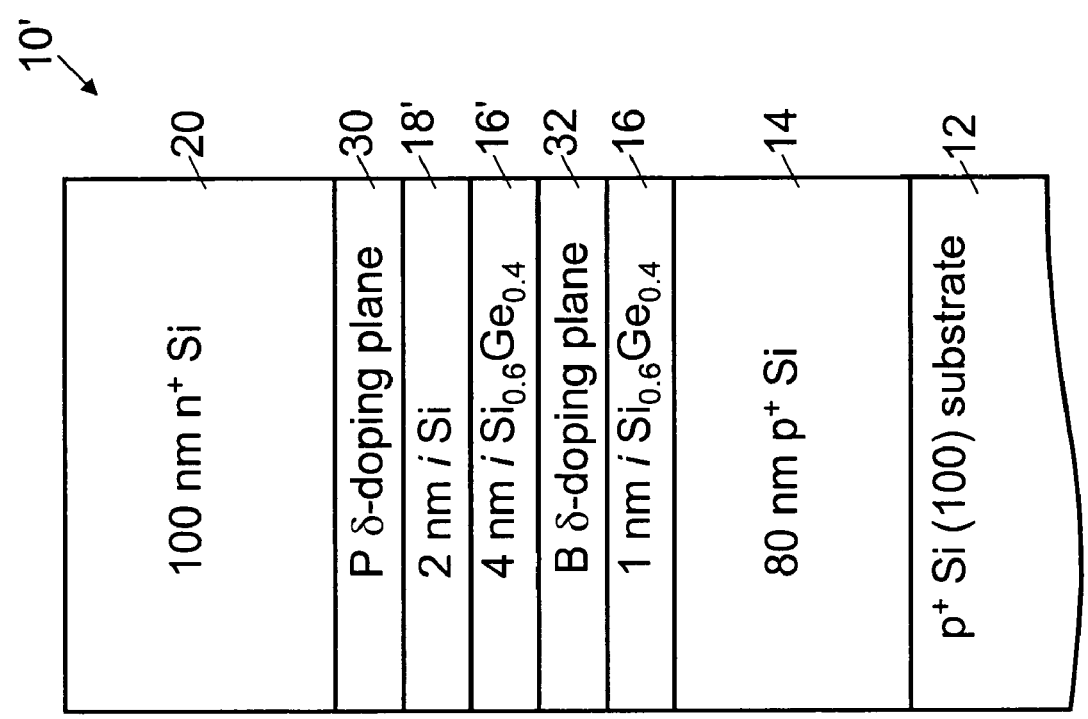
FIG. 3 diagrammatically shows a cross-sectional view of another Si-based backward diode structure that was fabricated and tested.

With reference to FIG. 3, samples of a modified Si-based backward diode structure 10' were also fabricated. The structure of FIG. 3 differs from that of FIG. 1A in that it includes an n-type (phosphorus) delta doping 30 adjacent the 100 nm phosphorous (P)-doped $n^+$ Si cap layer 20, and a p-type (boron) delta doping 32 adjacent the 1 nm nominally undoped $Si_{0.6}Ge_{0.4}$ layer 16. The 1 nm Si layer 18 is increased in thickness to a 2 nm Si layer 18' disposed between the delta dopings 30, 32, and an additional 4 nm (nominally undoped) $Si_{0.6}Ge_{0.4}$ layer 16' is also disposed between the delta dopings 30, 32. Although not shown, in some embodiments a second phosphorus delta doping is disposed at or near the top (exposed) surface of the phosphorus (P)-doped $n^+$ Si cap layer 20 to reduce contact resistance. Alternatively, Ge doping or another technique for reducing contact resistance can be employed.

Figure 4:
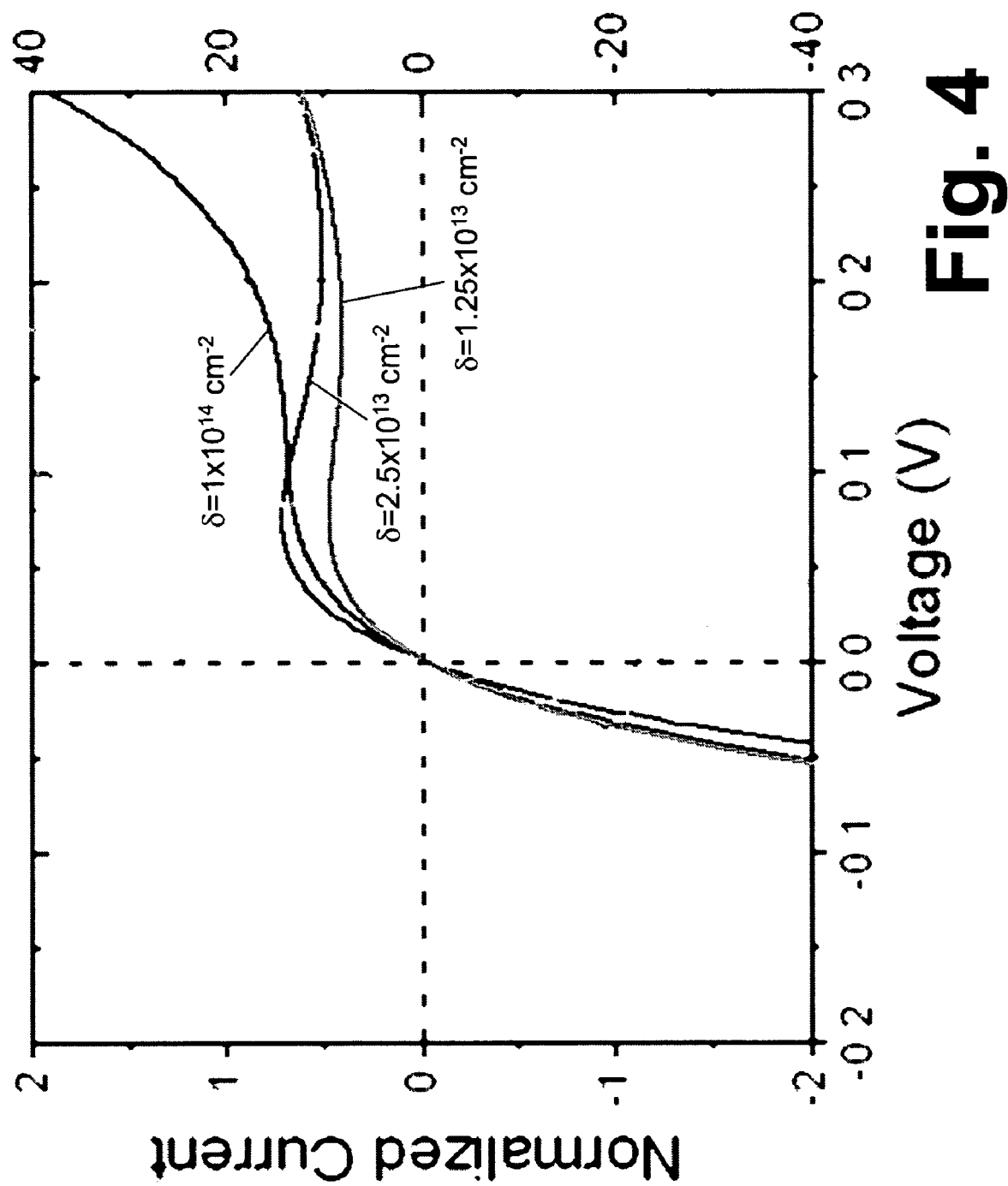
FIG. 4 plots current-voltage (I-V) characteristics of Si-based diodes having the structure of FIG. 3 and annealed at 875° C. for one minute, normalized using a multiplicative scaling factor to have identical zero biased junction conductance (dI/dV).

With reference to FIG. 4, I-V plots are shown for fabricated devices having the structure 10' of FIG. 3, with three different delta doping levels (in each sample the delta doping level of the n-type and p-type delta dopings 30, 32 are nominally the same, although it is contemplated to use different n-type and p-type delta doping levels), after rapid thermal anneal at 875° C. for 1 minute. For a device with delta sheet doping concentration, δ, equal to $1 \times 10^{14}$ cm$^{-2}$, the curvature coefficient γ was 22.4 V$^{-1}$. For a device with $\delta = 2.5 \times 10^{13}$ cm$^{-2}$, the curvature coefficient γ was 24.3 V$^{-1}$. For a device with $\delta = 1.25 \times 10^{13}$ cm$^{-2}$, the curvature coefficient γ was 25.4 V$^{-1}$. Thus, about the same high curvature coefficient (greater than or approximately equal to 22 V$^{-1}$) was observed for a substantial range of delta doping levels.

Figure 5:
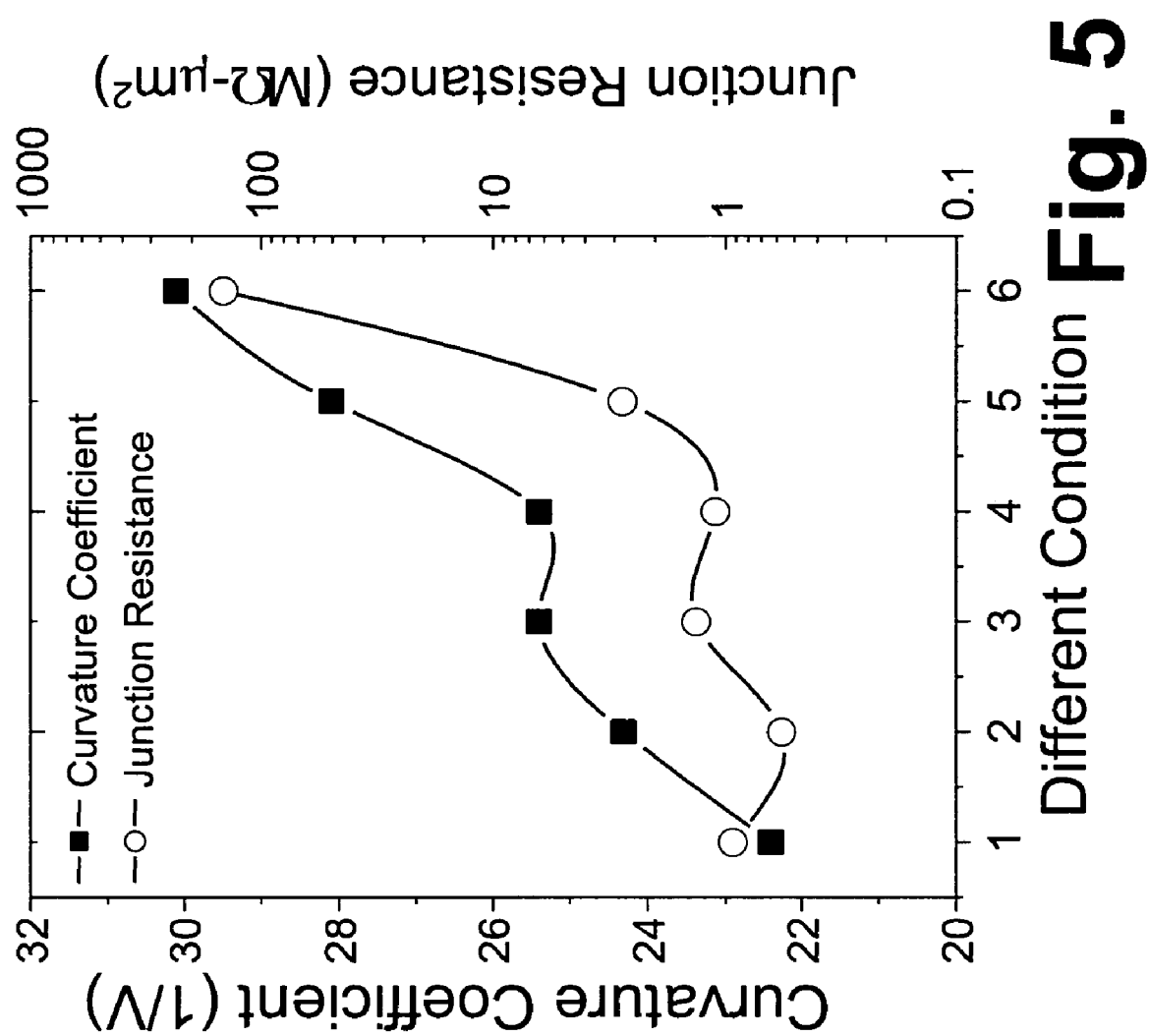
FIG. 5 plots curvature coefficient $\gamma$ and junction resistance $R_j$ for Si-based diodes having the structure of FIG. 3. The "Different Condition" correspond to samples with different delta dopings and/or different rapid thermal anneal temperatures.

With reference to FIG. 5, the delta dopings 30, 32 were found to substantially lower the junction resistance, $R_j$. FIG. 5 plots the curvature coefficient, γ, and the junction resistance, $R_j$, for a set of samples with the structure of FIG. 3 and having delta doping levels in the range $\delta = 2.5 \times 10^{13}$ cm$^{-2}$ to $\delta = 1 \times 10^{14}$ cm$^{-2}$, with post-growth rapid thermal anneals with a thermal budget in the range 725° C. to 900° C. for one minute. Junction resistances of as low as $R_j \sim 600$ kΩ-μm$^2$ were observed in conjunction with a curvature coefficient $\gamma \sim 24.4$ V$^{-1}$, with several samples exhibiting junction resistance less than or about 4 MΩ-μm$^2$ in conjunction with curvature coefficients of between about 22 V$^{-1}$ and 26 V$^{-1}$. This indicates that the delta dopings 30, 32 reduced junction resistance $R_j$. Thus, Si-based backward diodes having the structure 10' of FIG. 3 are also suitable for use as the pixel elements of the large area pixelated focal plane array.

The Si-based backward diode structures 10, 10' disclosed herein are suitably grown by low temperature MBE on a silicon substrate, because the bulk of the epitaxial material is silicon (e.g., silicon layers 14, 18, 18', 20) and the remaining material are thin coherently strained SiGe layers (e.g., $Si_{0.6}Ge_{0.4}$ layers 16, 16') having a total thickness of typically a few nanometers or less. In most embodiments, for systems applications to prevent detector crosstalk, it is contemplated for the silicon substrate to be minimally conducting, such as a silicon-on-insulator (SOI) substrate or high resistivity (HR) substrate. Moreover, epitaxial growth methods other than MBE are contemplated, such as chemical vapor deposition employing suitable gas-phase source materials such as silane and germane for silicon and germanium, respectively. Due to the relaxed dopant density requirements here compared to RITDs, growth techniques which are closer to equilibrium are contemplated, such as physical and chemical vapor deposition. Still further, while the illustrated example Si-based backward diode structures 10, 10' are n-on-p structures, it is also contemplated to employ a p-on-n structure, in which case the $n^+$ silicon region 20 suitably replaces the $p^+$ silicon region 14 as well as other active layers being switched in order of their deposition.

The structures 10, 10' are example structures, and other similar structures are expected to be suitable, such as structures including more than the illustrated one or two SiGe layers, structures with continuously- or stepwise-compositionally graded SiGe layers, structures with graded or stepwise doping changes, or so forth.

EXAMPLE 3

Asymmetric Si/SiGe Backward Diode with Delta-Doping

For example, FIG. 6A shows a contemplated Si-based backward diode structure 100 that is modified respective to the structure 10' of FIG. 3. The structure of FIG. 6A differs from that of FIG. 3 in that a thicker ~800 nm bottom $p^+$ silicon layer 140 and 2 nm SiGe layers 160, 161 having a higher germanium fraction of 0.5 and having symmetric 2 nm thicknesses symmetrically sandwiching the p-type (boron) delta doping 32. Additionally, the bottommost SiGe layer 160 is doped $p^+$.

The zero bias band structure for the structure 100 is shown in FIG. 6B. Although not shown, in some embodiments a second phosphorus delta doping is disposed at or near the top (exposed) surface of the phosphorus (P)-doped $n^+$ Si cap layer 20 to reduce contact resistance. Alternatively, Ge doping or another technique for reducing contact resistance can be employed. FIG. 6B diagrammatically shows an estimated zero bias band structure in the vicinity of the pn junction for the diode structure 100. The label "$E_c$" labels the conduction band edge; the label "$E_v$" labels the valence band edge; and the label "$E_F$" labels the Fermi level. The delta dopings 30, 32 are diagrammatically shown in FIG. 6B as planes; however, due to diffusion during growth and post-growth rapid thermal annealing, the delta dopings will generally be diffused or smeared out. Without being limited to any particular theory of operation, the n-type delta doping 30 of the diode structure 10' is believed to produce a pinned Fermi level 180 that is pinned at the n-side edge of the depletion width so that the depletion width does not extend into n-side due to asymmetric doping levels between p- and n-side. The p-type delta doping 32 is believed to promote a large valence band offset 182 for the SiGe layers 160, 161 at the p-side edge of the depletion width that enhances reverse-bias tunneling current. Additionally, it is believed that the p-type delta doping may produce a notch 184 in the conduction band that suppresses forward-bias diffusion current. Enhancement of the reverse tunneling current and suppression of the forward-bias current enhances the curvature coefficient, γ, around zero bias while providing a low junction resistance $R_j$ around zero bias.

In the example structures, a SiGe layer is incorporated into the Si-based pn junction, and is believed to reduce the tunnel barrier height, to enhance the momentum mixing, and hence to reduce the junction resistance. More generally, at least one non-silicon layer may be incorporated into the Si-based pn junction to improve the backward diode characteristic. For example, the Si-based pn junction may include a silicon-compatible layer of a material selected from a group consisting of Ge, C, Sn, $Si_{1-x}Ge_x$, $Si_{1-x}C_x$, $Si_{1-x}Sn_x$, $Si_{1-x-y}Ge_xC_y$, $Si_{1-x-y-z}Ge_xC_ySn_z$, or combinations thereof. In some contemplated embodiments, the SiGe or other non-silicon layer is omitted so that the Si-based pn junction is purely silicon (except for selected dopants or other low-level impurities). For example, it is contemplated that such a pure Si pn junction with one or more suitable delta dopings may provide an electrical junction with the desired backward diode characteristic.

In some contemplated embodiments the delta dopings are formed during molecular beam epitaxy growth by including an abrupt and complete growth stop during which the dopant source is applied. Alternatively, the growth can be substantially slowed, but not completely stopped, during the delta doping. The growth may employ chemical vapor deposition or another silicon-compatible growth technique besides molecular beam epitaxy. As is understood in the art, the term "delta doping" is intended to be broadly construed herein as relating to a relatively sharp doping profile such as is formed by applying a dopant source during a growth slowdown or a complete growth stop, and it is to be recognized that such a delta doping is substantially two-dimensional but may include some smearing or other spreading into the third dimension such as may be caused, for example, by dopant diffusion during a post-growth rapid thermal anneal.

A suitable backward diode characteristic is suitably obtained by enhancing tunneling in the reverse-bias direction. Accordingly, it is contemplated to have a substantially higher p-type delta doping versus the n-type delta doping. For example, in some contemplated embodiments the p-type delta doping may have a concentration that is about eight times higher than the concentration of the n-type delta doping. In some embodiments, it is contemplated to omit the n-type delta doping entirely while retaining the p-type delta doping to enhance tunneling at low reverse-bias voltages.

Example embodiments including the preferred embodiments have been described. Obviously, modifications and alterations will occur to others upon reading and understanding the preceding detailed description. It is intended that the example embodiments be construed as including all such modifications and alterations insofar as they come within the scope of the appended claims or the equivalents thereof.

The invention claimed is:

1. A backward diode comprising:
an n-type region;
a p-type region adjacent the n-type region to define a silicon-based p-n junction;
a tunnel barrier disposed at or near the silicon-based p-n junction, the tunnel barrier causing the forward tunneling current to be substantially smaller than the backward tunneling current at comparable voltage levels; and
wherein a portion of the n-type region at or near the silicon-based p-n junction has the Fermi level near the conduction band and a portion of the p-type region at or near the silicon-based p-n junction has the Fermi level near or below the valence band.

2. The backward diode as set forth in claim 1, wherein the tunnel barrier comprises:
a silicon-compatible layer adjacent a silicon layer forming an energy band offset between the silicon-compatible layer and the silicon layer, the silicon-compatible layer being selected from a group consisting of a Ge layer, a C layer, a Sn layer, a $Si_{1-x}Ge_x$ layer, a $Si_{1-x}C_x$ layer, a $Si_{1-x}Sn_x$ layer, a $Si_{1-x-y}Ge_xC_y$ layer, a $Si_{1-x-y-z}Ge_xC_ySn_z$ layer, and combinations thereof.

3. The backward diode as set forth in claim 1, further comprising at least one of:
a highly doped portion of the n-type region at or near the silicon-based p-n junction causing its Fermi level to be near the conduction band; and
a highly doped portion of the p-type region at or near the silicon-based p-n junction causing its Fermi level to be near or below the valence band.

4. The backward diode as set forth in claim 1, further comprising at least one of:
a delta doping disposed at or near the silicon-based p-n junction causing the Fermi level of the portion of the n-type region at or near the silicon-based p-n junction to be near the conduction band; and
a delta doping disposed at or near the silicon-based p-n junction causing the Fermi level of the portion of the p-type region at or near the silicon-based p-n junction to be near or below the valence band.

5. The backward diode as set forth in claim 1, wherein the tunnel barrier includes a nominally undoped layer.

6. The backward diode as set forth in claim 1, wherein the n-type and p-type regions have different doping levels that define the tunnel barrier as an asymmetric tunnel barrier that suppresses tunneling in only one direction.

7. The backward diode as set forth in claim 1, further comprising:
a spacer region disposed adjacent the tunnel barrier.

8. The backward diode as recited in claim 7, wherein the spacer layer is comprised predominately of $Si_{1-x}Ge_x$.

9. A backward diode comprising:
an n-type region;
a p-type region adjacent the n-type region to define a silicon-based p-n junction;
a quantum well disposed at or near the silicon-based p-n junction, the quantum well causing a ratio of forward current to backward current at comparable forward and reverse bias voltage levels to be substantially less than unity; and
wherein at least one of (i) a portion of the n-type region at or near the silicon-based p-n junction has its Fermi level near the conduction band and (ii) a portion of the p-type region at or near the silicon-based p-n junction has its Fermi level near or below the valence band.

10. The backward diode as set forth in claim 9, wherein the quantum well is defined at least partially by an energy band offset between a silicon layer and a non-silicon or silicon alloy layer.

11. The backward diode as set forth in claim 9, wherein the quantum well is defined at least partially by a highly doped layer.

12. The backward diode as recited in claim 9, wherein the quantum well is defined at least partially by a delta-doped layer.

13. The backward diode as set forth in claim 12, wherein the delta-doped layer further defines a barrier in the conduction band that suppresses forward diffusion current.

14. A Si-based diode comprising:
a silicon substrate; and
a Si-based pn junction disposed on the silicon substrate, the Si-based pn junction including silicon and at least one SiGe layer that reduces a tunneling barrier height, the Si-based pn junction having a backward diode current-voltage characteristic in which the forward tunneling current is substantially smaller than the backward tunneling current at comparable voltage levels.

15. The Si-based diode as set forth in claim 14, wherein the Si-based pn junction has a curvature coefficient at around zero bias of at least 15 $V^{-1}$.

16. The Si-based diode as set forth in claim 15, wherein the Si-based pn junction further has a junction resistance of less than or about 4 $M\Omega\text{-}\mu m^2$.

17. The Si-based diode as set forth in claim 14, wherein the unbiased Fermi level is just below the valence band on the p-side of the Si-based pn junction and just above the conduction band on the n-side of the Si-based pn junction.

18. The Si-based diode as set forth in claim 14, further comprising:
    at least one of (i) a p-type delta doping disposed on the p-side of the Si-based pn junction and (ii) an n-type delta doping disposed on the n-side of the Si-based pn junction.

19. The Si-based diode as set forth in claim 18, wherein said at least one delta doping has a diffused profile corresponding to a selected rapid thermal anneal.

20. The Si-based diode as set forth in claim 14, wherein the silicon substrate is a silicon-on-oxide (SOI) substrate.

21. A Si-based diode comprising:
    a silicon substrate;
    a Si-based pn junction disposed on the silicon substrate; and
    at least one delta doping disposed on the silicon substrate in or near the pn junction, the at least one delta doping together with the Si-based pn junction defining an electrical junction having a backward diode current-voltage characteristic in which the forward tunneling current is substantially smaller than the backward tunneling current at comparable voltage levels.

22. The Si-based diode as set forth in claim 21, wherein the delta doping includes:
    a p-type delta doping disposed on the p-side of the pn junction and causing the unbiased Fermi level on the p-side of the pn junction to be just below the valence band edge; and
    an n-type delta doping disposed on the n-side of the pn junction and causing the unbiased Fermi level on the n-side of the pn junction to be just above the conduction band edge.

23. The Si-based diode as set forth in claim 22, wherein the p-type delta doping is substantially higher than the n-type delta doping.

24. A Si-based diode formed by a method comprising:
    epitaxially depositing a Si-based diode structure on a silicon substrate, the Si-based diode structure including a Si-based pn junction having a backward diode current-voltage characteristic in which the forward tunneling current is substantially smaller than the backward tunneling current at comparable voltage levels.

25. The Si-based diode as set forth in claim 24, wherein the epitaxial depositing comprises:
    depositing a SiGe layer at or near the pn junction, the SiGe layer defining a quantum well that enhances backward tunneling current.

26. The Si-based diode as set forth in claim 25, wherein the epitaxial depositing is by low temperature molecular beam epitaxy.

27. The Si-based diode as set forth in claim 25, wherein the epitaxial depositing includes growing at least the Si-based pn junction with the silicon substrate at about 400° C. or lower.

28. The Si-based diode as set forth in claim 24, wherein the epitaxial depositing comprises performing at least one delta doping, the method further comprising:
    subsequent to the epitaxial depositing, performing a post-growth rapid thermal anneal to produce a diffused delta doping.

29. The Si-based diode as set forth in claim 28, wherein the post-growth rapid thermal anneal has a thermal budget of between about 725° C. for one minute and about 900° C. for about one minute.

* * * * *